United States Patent [19]

Pliefke et al.

[11] Patent Number: 4,834,844

[45] Date of Patent: May 30, 1989

[54] PROCESS FOR THE SELECTIVE ADDITIVE CORRECTION OF VOIDS IN COPYING LAYERS

[75] Inventors: Engelbert Pliefke; Werner Frass, both of Wiesbaden, Fed. Rep. of Germany

[73] Assignee: Hoechst Aktiengesellschaft, Frankfurt am Main, Fed. Rep. of Germany

[21] Appl. No.: 198,309

[22] Filed: May 25, 1988

[30] Foreign Application Priority Data

May 26, 1987 [DE] Fed. Rep. of Germany ....... 3717653

[51] Int. Cl.⁴ .............................................. C25D 5/02
[52] U.S. Cl. ..................................................... 204/16
[58] Field of Search ............. 204/15, 16, 224 R, 181.2

[56] References Cited

U.S. PATENT DOCUMENTS

| | | | |
|---|---|---|---|
| 2,603,593 | 7/1952 | Blickensderfer | 204/16 |
| 3,085,051 | 4/1963 | Hamm et al. | 204/18 |
| 3,095,808 | 7/1960 | Eastman | 101/149.2 |
| 3,106,155 | 10/1963 | Eastman et al. | 101/149.1 |
| 3,106,157 | 10/1963 | Reithel | 101/149.2 |
| 4,086,853 | 5/1978 | Figov et al. | 101/463 |
| 4,376,814 | 3/1983 | Walls | 430/272 |
| 4,383,897 | 5/1983 | Gillich et al. | 204/33 |
| 4,519,876 | 5/1985 | Lee et al. | 204/15 |

FOREIGN PATENT DOCUMENTS

| | | |
|---|---|---|
| 0030642 | 6/1981 | European Pat. Off. . |
| 0155231 | 9/1985 | European Pat. Off. . |
| 3305355 | 10/1986 | Fed. Rep. of Germany . |
| 51-78406 | 7/1976 | Japan . |
| 1490732 | 11/1977 | United Kingdom . |

Primary Examiner—T. M. Tufariello
Attorney, Agent, or Firm—Foley & Lardner, Schwartz, Jeffery, Schwaab, Mack, Blumenthal & Evans

[57] ABSTRACT

A process is disclosed for the selective additive correction of voids in copying layers, in which electrically conductive aqueous solutions of an organic compound are deposited in the void, with direct current connection between conductive substrate and at least one electrode, and with a current density in the range from 0.01 to 100 A/dm². The process is preferably carried out using organic polymers with substrates composed of metal, for example, aluminum, in grained and anodized form.

20 Claims, 1 Drawing Sheet

PROCESS FOR THE SELECTIVE ADDITIVE CORRECTION OF VOIDS IN COPYING LAYERS

BACKGROUND OF THE INVENTION

The present invention relates to a process for the selective additive correction of voids in copying layers of printing plates and conductor boards utilizing an aqueous electrolyte solution.

In the preparation of offset printing plates or photoresists (both referred to hereinafter as copying materials) radiation-sensitive (light-sensitive) reproduction layers are used, that, in general, are applied to a support by the customer or industrial manufacturer. The layer supports used in such copying materials include metals such as zinc, magnesium, chromium, copper, brass, steel, silicon, aluminum or combinations of these metals, plastic films, paper or similar materials. These supports can be coated with the radiation-sensitive reproduction layer without a modifying pretreatment, but preferably after carrying out a surface modification such as mechanical, chemical and/or electrochemical graining, surface oxidation and/or treatment with agents which impart hydrophilicity (for example, in the case of supports for offset printing plates). In addition to at least one radiation-sensitive compound, the conventional radiation-sensitive reproduction layers usually also contain an organic binder (e.g., resins) and, optionally, also plasticizers, pigments, dyes, surfactants, sensitizers, adhesion promoters, indicators and other customary auxiliary agents. In order to produce an image from these reproduction layers, the layers are developed after their irradiation(exposure) to obtain, for example, a printing form or a photoresist. In the case of electrophotographic layers, the step of decoating corresponds to the developing step. Within the scope of this invention, the term "reproduction layers" also includes layers that do not contain a radiation-sensitive compound, but contain the other above-mentioned components, i.e., in particular an organic binder.

The prior art has disclosed processes in which it is possible to produce a printing form without an irradiation and/or developing step and thus without using the customary reproduction layers containing a radiation-sensitive compound.

German Patent No. 24 33 448 (=U.S. Pat. No. 4,086,853) discloses the use of an electro-responsive recording blank comprising a) a hydrophobic underlayer (for example, of polyester), b) an electrically conductive hydrophilic layer (for example, of aluminum) arranged thereon, which can be locally removed by the action of current by means of a stylus, and c) a layer (composed, for example, of a cellulose derivative, a plasticizer and a pigment) that, as a result of the action of electric current, can be removed from layer b).

German Offenlegungsschrift No. 25 14 682 (=British Patent No. 1,490,732) describes the use of an electroresponsive recording material comprising a) an electrically conductive oleophilic layer which cannot be removed by the action of electric current and b) an oleophobic silicone rubber layer arranged thereon which can be locally removed by the action of current by means of a stylus.

Furthermore, European Patent Application No. 0,030,642 discloses a process for producing, by electroerosion, a printing form from a sheet-like material, comprising (a) a hydrophobic substrate layer (for example, of polyester), (b) a hydrophilic, electrically conductive intermediate layer (for example, of aluminum) and (c) a protective dielectric top layer (for example, of $Al_2O_3$), in which process both layers (c) and (b) are removed by the action of electrodes.

These prior art processes are based on an imagewise removal of layer components by electrochemical degradation.

European Patent Application No. 0,155,231 describes electro dipcoating of a printed circuit board that, after coating, is processed by imagewise exposure and development.

According to European Patent No. 0,089,510 (=U.S. Pat. No. 4,376,814) a hydrophilic polymer is electrochemically deposited on a printing plate.

It is true that, in the two processes, polymers are deposited by electro dipcoating, but imagewise differentiation is not used in these processes.

Imagewise differentiation is described in the following publications:

U.S. Pat. No. 4,519,876 discloses an electrically conductive substrate carrying an insulating layer which can be removed imagewise after exposure to laser energy. Thereafter, metal is electrolytically deposited in the exposed regions which are no longer protected.

In Japanese Patent Application Disclosure No. 51-078,406 an analogous process is described, in which a screen printing mask is used as an original and metal is electrodeposited in the uncovered portions of the screen.

In addition, the patent literature has disclosed processes wherein deposits are produced by an electrophotographic route or by means of conductivity patterns.

U.S. Pat. Nos. 3,106,157 and 3,085,051, for example, describe processes, in which the conductivity pattern produced by imagewise exposure serves to deposit indium or nickel atoms.

U.S. Pat. No. 3,095,808 describes the utilization of photoconductivity after imagewise exposure for depositing a Fe, Cu, Ni or Co salt of rubeanic acid.

According to U.S. Pat. No. 3,106,155 a photoconductivity pattern created by imagewise exposure is "developed," by means of polymers, for example, by cellulose acetate phthalate.

In all these processes imagewise exposure must first be carried out to produce a conductivity pattern which is fixed in further process steps.

SUMMARY OF THE INVENTION

It is an object of the present invention to develop a process, in which imagewise differentiation is achieved by simple means.

In accordance with these and other objects, there is provided a process for the selective additive correction of voids in a copying layer, comprising the steps of positioning an electrode adjacent a selected void on a substrate, applying a direct voltage between the electrode and the selected void on the substrate, causing a direct current to flow; and depositing in the selected void an organic substance from an electrically conductive solution disposed between the selected void on the substrate and the electrode at a current density in the range from 0.01 to 100 $A/dm^2$.

Other objects, features and advantages of the present invention will become apparent from the following detailed description. It should be understood, however, that the detailed description and the specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Figure 1A:
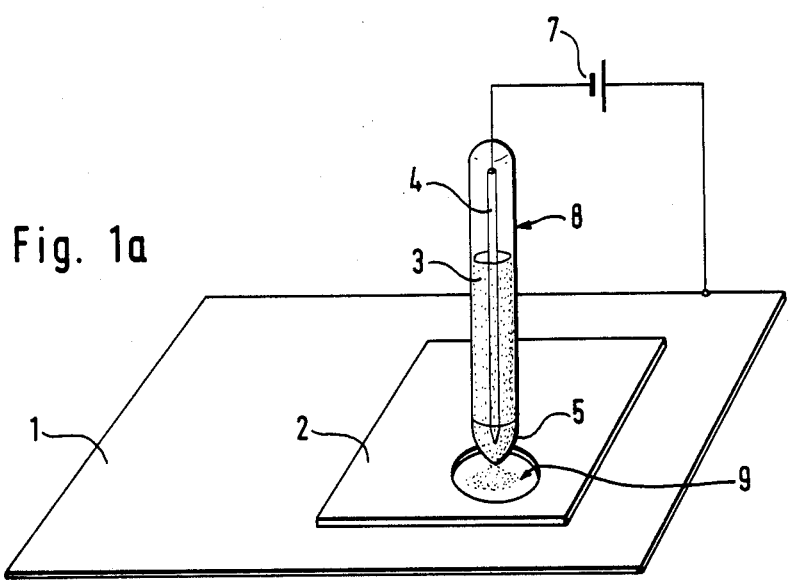
FIG. 1a shows an embodiment of the present invention.

The process of the present invention is based on the electro dipcoating process and on the processes used in lithography for the additive correction of exposed and developed printing plates or printed circuit boards by currentless, imagewise application of a varnish or resin in places which were initially not reproduced in the original. In electro dipcoating, current is applied in an aqueous electrolyte system and thus an initially dissolved organic substance is either cathodically or anodically deposited on the workpiece to be coated. The present invention is characterized in that these organic compounds, preferably polymers, are deposited imagewise in the additive correction of printing plates or printed circuit boards, under the action of electric current.

One possible embodiment of this invention comprises, in the simplest case, a stylus-type electrode surrounded by electrophoretic paint which is brought to the smallest possible distance above the plate to be corrected. By means of a short current pulse, it is possible to induce a punctiform deposition of a resin from the electrophoretic bath at image-free places on the plate. By cyclically repeating this process, entire (printing) plate regions can be covered with image.

Even small faults in the form of uncoated places in full tones can be corrected without difficulty by traversing the corresponding plate regions under the action of current.

In the case of the embodiment with the stylus-type electrode, the advantages of the process according to the invention lie in the fact that, for example, in correcting faults in full tone regions, the deposition takes place only in the uncoated places so that conductivity is provided only at those points. Any paint residues on parts already coated are not cured and can be removed by simply rinsing with water.

A further advantage of the process according to the invention is the fact that it is possible to correct additively with aqueous, preferably solvent-free, solutions without incipiently dissolving parts of the reproduction layer that may have been present previously. From a process standpoint, a solvent-free solution is one which does not contain an amount of organic solvent which would adversely affect a reproduction layer.

The print run durability of the additive correction points can be decisively improved by suitable choice of the organic compounds deposited since it is possible to provide extremely good anchorage for the layer by the process according to the invention.

In contrast to the image-related metal deposition cited as prior art, a continuous layer is achieved by the process according to the invention, of additive correction with an organic compound even at very low charge quantities, and this makes possible a deposition even by means of a battery-operated unit.

By the process according to the invention it is therefore possible to deposit various types of resin in an image-related manner from aqueous solutions which do not have to contain any organic solvents or other large quantities of environment-polluting adjuvants. From an environmental standpoint, a solvent-free solution is one that does not contain an amount of organic solvent which would cause a pollution problem.

The concentration of the aqueous solutions or dispersions (in the following simply called "solution") may be between about 0.1% by weight, in particular about 1% by weight, and the appropriate saturation concentration of the dissociated compound, but, in general, concentrations of up to about 20% by weight are adequate. If the concentration of the aqueous electrolyte is below about 0.1% by weight, then the conductivity of the solution is usually too low, so that the resulting current density is too low to make possible an additive correction which proceeds sufficiently rapidly. The temperature of the aqueous electrolyte may extend from room temperature up to the boiling point of the electrolyte system, but a temperature of about 20° to 70° C. is preferably maintained. Mixing of the aqueous electrolyte while the process according to the invention is being carried out is, in general, not necessary. For a simple correction, it may also be advantageous to use a very concentrated electrolyte system.

The process according to the invention is carried out with direct current, optionally with modulation, but pulsed direct current may also be employed. The current density may lie in principle outside a range of about 0.01 to 100 A/dm$^2$, but this range is preferred since the heating of the aqueous electrolyte solution is too severe or the rate of deposition is too low and/or the image production may be adversely affected in relation to duration or quality. The current density rises at the beginning of the electrochemical additive correction, remains level for a certain time and falls considerably again towards the end of the treatment.

During the electrochemical additive correction, hydrogen is liberated by discharge of $H^+(H_3O^+)$ ions at the cathode in the case of cathodic deposition. It is assumed that, as a result of this, the local pH value rises considerably and produces the deposition which differentiates in an image-related manner. Analogously, in the case of anodic image-related electrophoretic coating, the deposition takes place as a result of a drop in the pH value.

The term "electrode of stylus-type construction" is to be understood to mean an elongated body composed of a material that is as inert as possible (i.e., a material which does not degrade during the process according to the invention), such as stainless steel, graphite, gold or platinum and which has as small a point as possible for good resolution and the additive correction of the finest elements. This electrode is brought to the smallest possible distance above the laminar material to be coated with image.

FIG. 1a shows one possible embodiment. Plate conventionally covered with image and developed, is wired as one pole to direct current source 7. Some of electrophoretic painting liquid 3 is pressed out of the pores of electrically nonconducting membrane 5 with correction stylus 8, which represents the other voltage pole, by traversing the place 9 to be additively corrected in copying coating 2. As a result of a brief current flow, the electrophoretic resin is deposited selectively at the correction point via electrode 4 inserted in the stylus and builds up continuous layer 6.

Figure 1B:
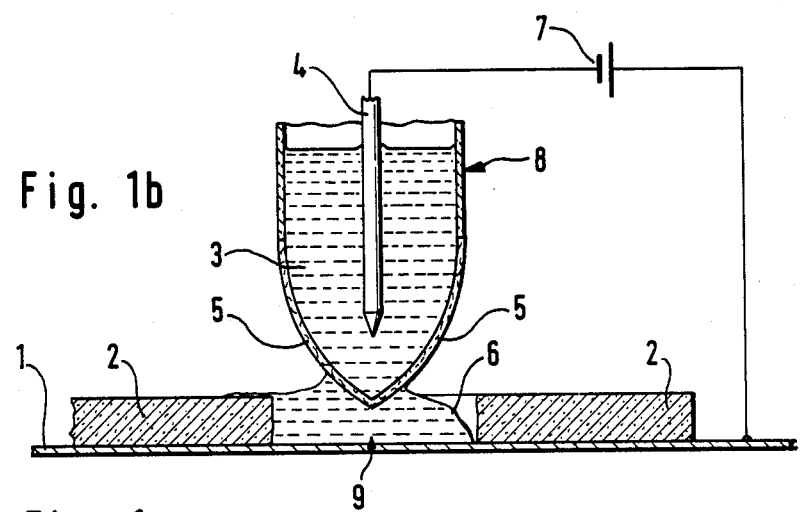
FIG. 1b is an enlarged view of the embodiment of FIG. 1a during deposition of the electrophoretic resin.
Figure 1C:
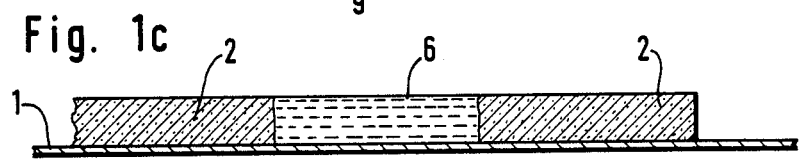
FIG. 1c is an enlarged view of a corrected void.

FIGS. 1b and 1c show enlarged views of the original fault during and after correction, respectively.

The aqueous electrolyte solution must be so disposed in relation to the material and the electrode of stylus-type construction that it produces an image-related additive correction of the reproduction coating in interaction with the two bodies acting as electrodes and that current flows between the plate and the electrode. In the process according to the invention, the reproduction layers include not only the usual, known radiation-sensitive coatings described later, but also those of comparable composition that do not contain any radiation-sensitive compound. Quite generally, reproduction layers are to be understood to mean those layers that make an image-related differentiation possible.

In a preferred embodiment of the process according to the invention, contact is made to the plate to be additively corrected at the correction points by brushing with the binder-containing electrolyte solution. At the same time, an edge of the laminar plate material should be connected to the current source. Another possibility for supplying current lies in making contact via the rear side of the material. The correction stylus of needle-type construction should be disposed at a uniform distance with respect to the laminar substrate so that a uniform current density can be established at every point on the laminar material to be covered with image. This can be ensured, for example, by means of the insulating membrane material. The advantage of the process lies in the fact that the size of the correction points can be controlled by varying voltage and time.

The reproduction layer part produced according to the invention by the additive correction contains, as a rule, a polymeric binder that is deposited in an image-related manner from the electrode of stylus-type construction under the action of the electrical current. However, those depositions based on a polymeric binder that contains a radiation-sensitive compound are also understood to fall within the invention, but preferably they are employed as radiation-sensitive coatings. Suitable substrate materials are electrically conductive base materials that include, for example, those having coatings of zinc, chromium, magnesium, copper, brass, steel, silicon, aluminum or their alloys or combinations of these metals. These may be provided with an image electrochemically without a special modifying pretreatment using a suitable reproduction layer, but preferably this is carried out only after a surface modification, such as a mechanical, chemical or electrochemical graining, an oxidation and/or a treatment with hydrophilizing agents (in particular, in the case of bases for offset printing plates).

Particularly suitable substrates for the preparation of offset printing plates include those made of aluminum or one of its alloys, which, for example, have an aluminum content of more than about 98.0% by weight, and in particular of more than about 98.5% by weight, and additionally contain Si, Fe, Ti, Cu, Zn, Mn and/or Mg constituents.

Aluminum support materials for printing plates, which are very common in practice, are generally grained before application of the reproduction layer. Graining may be effected mechanically (for example, by brushing and/or by treatment with abrasive agents), chemically (for example, by means of etching agents) or electrochemically (for example, by treatment with alternating current in aqueous HCl or HNO$_3$ solutions). The mean peak-to-valley height R$_z$ of the grained surface is in the range from about 1 $\mu$m to 15 $\mu$m, in particular from about 1.5 $\mu$m to 10 $\mu$m. The peak-to-valley height is determined according to DIN 4768, in the October 1970 version, the peak-to-valley-height R$_z$ is then the arithmetic mean calculated from the individual peak-to-valley height values of five mutually adjacent individual measurement lengths.

Prior to graining, the aluminum can be subjected to a precleaning treatment. Precleaning includes, for example, treatment with an aqueous NaOH solution with or without a degreasing agent and/or complex formers, trichloroethylene, acetone, methanol or other commercially available, so-called "aluminum pickles." Following graining or, in the case of several graining steps, between the individual steps, it is possible to perform an additional etching treatment, during which in particular a maximum amount of about 5 g/m$^2$ is removed. Etching solutions employed generally comprise aqueous alkali metal hydroxide solutions or aqueous solutions of salts showing alkaline reactions or aqueous solutions of acids based on HNO$_3$, H$_2$SO$_4$ or H$_3$PO$_4$. Apart from an etching treatment step performed between the graining step and an optional subsequent anodizing step, nonelectrochemical treatments are also known, which substantially have a purely rinsing and/or cleaning effect and are, for example, employed to remove deposits which have formed during graining ("smut"), or simply to remove residues from the treatment, dilute aqueous alkali metal hydroxide solutions or water are, for example, used for these treatments.

The graining process(es) is/are optionally followed by an anodic oxidation of the aluminum in a further process step, in order to improve, for example, the abrasion and adhesion properties of the surface of the support material. Conventional electrolytes, such as H$_2$SO$_4$, H$_3$PO$_4$, H$_2$C$_2$O$_4$, amidosulfonic acid, sulfosuccinic acid, sulfosalicylic acid or mixtures thereof, can be used for the anodic oxidation; particular preference is given to H$_2$SO$_4$ and H$_3$PO$_4$, which may be used alone or in a mixture and/or in a multi-stage anodizing process. The weights of the aluminum oxide layers vary from about 1 g/m$^2$ to 10 g/m$^2$, which corresponds to layer thicknesses between about 0.3 $\mu$m and 3.0 $\mu$m.

The step of performing an anodic oxidation of the aluminum support material is optionally followed by one or more post-treating steps. Post-treating is particularly understood to be a hydrophilizing chemical or electrochemical treatment of the aluminum oxide layer, for example, an immersion treatment of the material in an aqueous solution of polyvinyl phosphonic acid according to German Patent No. 16 21 478 (=British Patent No. 1,230,447), an immersion treatment in an aqueous solution of an alkali metal silicate according to German Auslegeschrift No. 14 71 707 (=U.S. Pat. No. 3,181,461), or an electrochemical treatment (anodic oxidation) in an aqueous solution of an alkali metal silicate according to German Offenlegungsschrift No. 25 32 769 (=U.S. Pat. No. 3,902,976). These post-treatment steps serve, in particular, to improve even further the hydrophilic properties of the aluminum oxide layer, which are already sufficient for many fields of application, with the other well-known properties of the layer being at least maintained.

Suitable radiation-sensitive (photosensitive) layers include any layers that—in accordance with conventional methods that according to this invention are, however, not required—after irradiation (exposure), optionally followed by development and/or fixing, yield a surface in imagewise configuration which can be used for printing.

The light-sensitive reproduction layers include those which are, for example, described in Light-Sensitive Systems by Jaromir Kosar, published by John Wiley & Sons, New York, 1965: colloid layers containing chromates and dichromates (Kosar, Chapter 2); layers containing unsaturated compounds in which these compounds are isomerized, rearranged, cyclized, or crosslinked upon exposure (Kosar, Chapter 4); layers containing compounds that can be photopolymerized, in which monomers or prepolymers, undergo polymerization on being exposed, optionally with the aid of an initiator (Kosar, Chapter 5); and layers containing o-diazoquinones, such as naphthoquinone diazides, p-diazoquinones, or condensation products of diazonium salts (Kosar, Chapter 7). The layers which are suitable also include the electrophotographic layers, i.e., layers that contain an inorganic or organic photoconductor. In addition to the radiation-sensitive substances, these layers can, of course, also contain other constituents, such as for example, resins, dyes or plasticizers.

If the above-described layers containing radiation-sensitive compounds include at least one binder, they are preferably employed without the radiation-sensitive compound in the process of this invention. The following organic polymers, that are soluble in aqueous electrolytes are then particularly suitable: polyamides, polyesters, alkyd resins, polyvinyl alcohol, polyvinyl pyrrolidone, polyethylene oxide, polyacetals, gelatin, cellulose ethers, melamine-formaldehyde resins, amino resins, acrylic resins and/or polyepoxides (e.g. on a basis of epoxidized linseed oil); it is, however, also possible to use other types of binders which are capable of being deposited in an electrolytic process.

The thickness of the reproduction layer may vary in the range from about 0.1 to about 100 μm or above.

In cases in which the reproduction layers built up by additive correction contain as radiation-sensitive compounds those which yield a negative-working system, subsequent exposure or subsequent heating of the laminar material over its whole area after the additive correction from the reproduction layer side is advisable; in the case of a positive-working system, no special subsequent exposure needs to be carried out.

In order to achieve even higher print runs, "baking", i.e. a thermal treatment or comparable posttreatment of the laminar material, is possible after the additive correction according to the invention has been carried out in order to increase the mechanical and/or chemical stability of the image areas.

In the following examples and in the above description, unless otherwise specified, the percentage data relate to the weight. Parts by weight relate to parts by volume as g to cm$^3$. The reproduction layers to be treated are situated on conductive bases and these are wired, in the Examples 1 to 37, as cathode in a direct current circuit, the electrode of stylus-type construction then being the anode. In Examples 38 to 51 the substrate to be covered with image is the anode. The electrolyte temperature is, unless otherwise specified, 25° to 30° C.

The variation in current density may be represented as a rule as follows: the current density rises in the course of a few msec first to a certain value, remains for a few msec at this level and falls off considerably towards the end of the electrolytic development. If no special remarks are made, the materials treated are as required for practical purposes. At higher voltages, care should be taken to ensure that the plate is at ground since dangerous current breakdowns may otherwise occur.

EXAMPLES

In the following examples, the plates additively corrected using the process according to the invention are electrochemically grained and anodized aluminum plates. The following electrophoretic painting solutions were used for additive correction:

(A)

200 g of epoxy resin ®Resydrol 16989 manufactured by Hoechst AG (60% in ethylene glycol ethyl ether)
2.75 g of formic acid
797 ml of water (B)

as A, but additionally containing 33 g of hardener SWX 596

(C)

200 g of epoxy resin ®Resydrol SWE 5186
2.75 g of formic acid
797 ml of water (D)

174 g of epoxy resin ®Resydrol SVK 5140 (69%)
2.8 g of formic acid
823 ml of water (E)

182 g of epoxy resin ®Resydrol SVK 5145 (66%)
2.75 g of formic acid
816 ml of water

RESIN SOLUTIONS THAT CAN BE DEPOSITED ANODICALLY (F)

133 g of acrylate resin ®Resydrol WY 323 (75%)
26 g of melamine resin ®Maprenal MF 910 (90%)
12 g of diethanolamine
1250 ml of water (G)

133 g of melamine resin ®Resydrol WM 461 E
12 g of diisopropanolamine
1000 ml of water (H) 171 g of polybutadiene resin ®Resydrol SWP 195 E 17 g of 10% NH$_3$ solution
1000 ml of water (I)

200 g of maleic acid adduct ®Resydrol SWX 213 E
20 g of 10% NH$_3$ solution
1000 ml of water For better anchorage, the plate may additionally be thermally post-hardened (5 min, 100° C.) after the additive correction.

The Examples 1 to 37 were deposited as cataphoretic paints, and the examples 38 to 51 as anophoretic paints (substrate as anode).

TABLE 1

| Example No. | Type of electrolyte | Voltage V | Time sec | Post-hardening | Quality of deposit and ink absorption |
|---|---|---|---|---|---|
| 1 | A | 100 | 1 | — | good |
| 2 | A | 20 | 1 | — | very good |
| 3 | A | 20 | 2.5 | — | very good |
| 4 | A | 20 | 5 | — | very good |
| 5 | A | 40 | 2.5 | — | very good |
| 6 | A | 40 | 5 | — | very good |
| 7 | A | 60 | 1 | — | very good |
| 8 | A | 60 | 3 | — | very good |
| 9 | A | 60 | 5 | — | very good |
| 10 | A | 80 | 0.1 | — | very good |
| 11 | A | 80 | 1 | — | very good |
| 12 | A | 100 | 0.01 | — | very good |
| 13 | A | 100 | 0.1 | — | very good |
| 14 | A | 100 | 1 | — | very good |
| 15 | A | 200 | 0.001 | — | very good |
| 16 | A | 200 | 0.01 | — | very good |
| 17 | A | 200 | 0.1 | — | very good |
| 18 | A | 200 | 1 | — | very good |
| 19 | B | 10 | 5 | — | very good |
| 20 | B | 20 | 1 | — | very good |
| 21 | B | 20 | 2.5 | — | very good |
| 22 | B | 20 | 5 | — | very good |
| 23 | B | 40 | 2.5 | — | very good |
| 24 | B | 40 | 5 | — | very good |
| 25 | C | 20 | 5 | — | good |
| 26 | C | 20 | 10 | — | good |
| 27 | C | 40 | 2.5 | — | good |
| 28 | C | 40 | 5 | — | good |
| 29 | D | 10 | 1 | — | very good |
| 30 | D | 10 | 10 | — | very good |
| 31 | D | 20 | 10 | — | very good |
| 32 | D | 40 | 1 | — | very good |
| 33 | E | 10 | 1 | — | very good |
| 34 | E | 20 | 15 | — | very good |
| 35 | E | 30 | 20 | — | very good |
| 36 | E | 40 | 10 | — | very good |
| 37 | E | 40 | 15 | — | very good |
| 38 | F | 40 | 30 | yes | very good |
| 39 | G | 40 | 1 | yes | very good |
| 40 | G | 40 | 5 | yes | very good |
| 41 | G | 60 | 0.5 | yes | very good |
| 42 | G | 60 | 1 | yes | very good |
| 43 | G | 210 | 0.001 | yes | very good |
| 44 | G | 210 | 0.01 | yes | very good |
| 45 | G | 210 | 0.1 | yes | very good |
| 46 | G | 210 | 1 | yes | very good |
| 47 | H | 200 | 5 | yes | very good |
| 48 | I | 20 | 15 | yes | good |
| 49 | I | 30 | 15 | yes | very good |
| 50 | I | 40 | 2 | yes | very good |
| 51 | I | 80 | 1 | yes | very good |

EXAMPLE 52

The resin solution F is dispersed with 20 g of a polycondensation product from 1 mol of 3-methoxy-diphenylamine -4-diazonium sulfate and 1 mol of 4,4'-bis(methoxy-methyl)diphenyl ether, precipitated as methylsulfonate, and used as electrophoretic paint. A grained and anodized aluminum plate is anodically connected for 2 s at 30 V in the solution so prepared and an image-related coated plate is produced whose coating is still photosensitive (negative-working) and is available for a second patterning by normal exposure to UV.

What is claimed is:

1. A process for selective additive correction of voids in a copying layer on a conductive substrate, comprising the steps of:
    (a) positioning an electrode adjacent a selected void on a substrate;
    (b) applying a voltage between said electrode and said selected void on said substrate, causing a direct current to flow; and
    (c) depositing in said selected void an organic substance from an electrically conductive solution disposed between said selected void on said substrate said electrode at a current density in the range from 0.01 to 100 A/dm$^2$
    wherein the organic substance is contained in a body surrounding the electrode.
2. The process as claimed in claim 1, wherein the organic substance is a polymer.
3. The process as claimed in claim 1, wherein the concentration of the organic substance is 0.1 by weight up to the saturation limit.
4. The process as claimed in claim 3, wherein the concentration is up to 20% by weight.
5. The process as claimed in claim 1, wherein said conductive substrate is a metal substrate.
6. The process as claimed in claim 5, wherein the metal is aluminum.
7. The process as claimed in claim 1, wherein the surface of said conductive substrate is modified before application of said copying layer.
8. The process as claimed in claim 1, wherein the organic substance additionally comprises radiation-sensitive constituents.
9. The process as claimed in claim 1, wherein the pH value of the electrically conductive solution is in the range from 2 to 10.
10. The process as claimed in claim 1, wherein the electrically conductive solution comprises a gel.
11. The process as claimed in claim 7, wherein said surface modification comprises at least one treatment selected from the group consisting of mechanical graining, chemical graining, electrochemical graining, hydrophilizing and anodization.
12. The process as claimed in claim 1, wherein said conductive substrate functions as an anode.
13. The process as claimed in claim 1, wherein said conductive substrate functions as a cathode.
14. The process as claimed in claim 1, additionally comprising the step of varying voltage and time to control the depositing of said organic substance.
15. The process as claimed in claim 1, wherein a portion of the body comprises a porous membrane.
16. The process as claimed in claim 15, wherein the organic substance passes through the pores of the membrane and is deposited in the selected void.
17. The process as claimed in claim 1, wherein steps (a), (b) and (c) are repeated.
18. The process as claimed in claim 1, consisting essentially of the recited steps.
19. The process as claimed in claim 1, wherein said conductive solution is aqueous.
20. The process as claimed in claim 19, wherein said conductive solution is essentially solvent-free.

* * * * *